US012347519B2

(12) United States Patent
Gajapathy

(10) Patent No.: US 12,347,519 B2
(45) Date of Patent: *Jul. 1, 2025

(54) METHODS FOR READING DATA FROM A STORAGE BUFFER INCLUDING DELAYING ACTIVATION OF A COLUMN SELECT

(71) Applicant: Micron Technology, Inc., Boise, ID (US)

(72) Inventor: Parthasarathy Gajapathy, Highland Village, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/966,350

(22) Filed: Oct. 14, 2022

(65) Prior Publication Data

US 2023/0039948 A1    Feb. 9, 2023

Related U.S. Application Data

(63) Continuation of application No. 15/965,263, filed on Apr. 27, 2018, now Pat. No. 11,488,645, which is a continuation of application No. 13/445,659, filed on Apr. 12, 2012, now abandoned.

(51) Int. Cl.
*G11C 7/12* (2006.01)
*G11C 7/10* (2006.01)
*G11C 8/18* (2006.01)
*G11C 11/4076* (2006.01)

(52) U.S. Cl.
CPC .............. *G11C 7/12* (2013.01); *G11C 7/1018* (2013.01); *G11C 8/18* (2013.01); *G11C 11/4076* (2013.01)

(58) Field of Classification Search
CPC ............ G11C 7/12; G11C 7/1018; G11C 8/18; G11C 11/4076
See application file for complete search history.

(56) References Cited

U.S. PATENT DOCUMENTS

| 3,849,762 A | 11/1974 | Fujimoto et al. |
| 3,921,136 A | 11/1975 | Bar-Lev |
| 4,011,547 A | 3/1977 | Kimmel |

(Continued)

FOREIGN PATENT DOCUMENTS

| EP | 0476159 A1 | 3/1992 |
| EP | 0943995 | 9/1999 |

(Continued)

OTHER PUBLICATIONS

Beesley, K. R.; Arabic Morphology Using Only Finite-State Operations; Xerox Research Centre Europe; pp. 50-57; 1998.

(Continued)

*Primary Examiner* — Eric T Loonan
(74) *Attorney, Agent, or Firm* — Fletcher Yoder, P.C.

(57) ABSTRACT

Disclosed are methods for reading data from a storage buffer. One such method may include retrieving a first set of data during a first period of time. The method may also include delaying data retrieval during a second period of time after the first period of time. The method may include outputting at least a portion of the first set of data during the first period of time and the second period of time. The first period of time is substantially similar to the second period of time.

30 Claims, 6 Drawing Sheets

(56) References Cited

U.S. PATENT DOCUMENTS

| | | | |
|---|---|---|---|
| 4,014,000 A | 3/1977 | Uno et al. |
| 4,123,695 A | 10/1978 | Hale et al. |
| 4,153,897 A | 5/1979 | Yasuda et al. |
| 4,204,193 A | 5/1980 | Schroeder |
| 4,414,685 A | 11/1983 | Sternberg |
| 4,748,674 A | 5/1988 | Freeman |
| 5,014,327 A | 5/1991 | Potter et al. |
| 5,028,821 A | 7/1991 | Kaplinsky |
| 5,216,748 A | 6/1993 | Quenot et al. |
| 5,257,361 A | 10/1993 | Doi et al. |
| 5,287,523 A | 2/1994 | Allison et al. |
| 5,291,482 A | 3/1994 | McHarg et al. |
| 5,300,830 A | 4/1994 | Hawes |
| 5,331,227 A | 7/1994 | Hawes |
| 5,357,512 A | 10/1994 | Khaira et al. |
| 5,371,878 A | 12/1994 | Coker |
| 5,377,129 A | 12/1994 | Molvig et al. |
| 5,459,798 A | 10/1995 | Bailey et al. |
| 5,615,237 A | 3/1997 | Chang et al. |
| 5,659,551 A | 8/1997 | Huott et al. |
| 5,723,984 A | 3/1998 | Sharpe-Geisier |
| 5,754,878 A | 5/1998 | Asghar et al. |
| 5,790,531 A | 8/1998 | Ellebracht et al. |
| 5,881,312 A | 3/1999 | Dulong |
| 5,896,548 A | 4/1999 | Ofek |
| 5,956,741 A | 9/1999 | Jones |
| 6,011,407 A | 1/2000 | New |
| 6,016,361 A | 1/2000 | Hongu et al. |
| 6,034,918 A * | 3/2000 | Farmwald ............ G06F 12/0684 711/E12.089 |
| 6,034,963 A | 3/2000 | Minami et al. |
| 6,041,405 A | 3/2000 | Green |
| 6,052,766 A | 4/2000 | Betker et al. |
| 6,058,469 A | 5/2000 | Baxter |
| 6,094,711 A * | 7/2000 | Wong ................. G06F 12/0859 712/E9.046 |
| 6,151,644 A | 11/2000 | Wu |
| 6,240,003 B1 | 5/2001 | McElroy |
| 6,279,128 B1 | 8/2001 | Arnold et al. |
| 6,317,427 B1 | 11/2001 | Augusta et al. |
| 6,321,315 B1 * | 11/2001 | LaBerge ............ G06F 13/4243 711/167 |
| 6,338,137 B1 * | 1/2002 | Shiell ................. G06F 9/30043 712/225 |
| 6,362,868 B1 | 3/2002 | Silverbrook |
| 6,400,996 B1 | 6/2002 | Hoffberg et al. |
| 6,606,699 B2 | 8/2003 | Pechanek et al. |
| 6,614,703 B2 | 9/2003 | Pitts et al. |
| 6,625,740 B1 | 9/2003 | Datar et al. |
| 6,633,443 B1 | 10/2003 | Watanabe et al. |
| 6,636,483 B1 | 10/2003 | Pannell |
| 6,640,262 B1 | 10/2003 | Uppunda et al. |
| 6,665,209 B2 | 12/2003 | Osada et al. |
| 6,697,979 B1 | 2/2004 | Vorbach et al. |
| 6,700,404 B1 | 3/2004 | Feng et al. |
| 6,880,087 B1 | 4/2005 | Carter |
| 6,906,938 B2 | 6/2005 | Kaginele |
| 6,928,494 B1 * | 8/2005 | Volk .......... G11C 7/10 710/52 |
| 6,944,710 B2 | 9/2005 | Regev et al. |
| 6,977,897 B1 | 12/2005 | Nelson et al. |
| 7,010,639 B2 | 3/2006 | Larson et al. |
| 7,089,352 B2 | 8/2006 | Regev et al. |
| 7,146,643 B2 | 12/2006 | Dapp et al. |
| 7,176,717 B2 | 2/2007 | Sunkavalli et al. |
| 7,276,934 B1 | 10/2007 | Young |
| 7,305,047 B1 | 12/2007 | Turner |
| 7,358,761 B1 | 4/2008 | Sunkavalli et al. |
| 7,366,352 B2 | 4/2008 | Kravec et al. |
| 7,392,229 B2 | 6/2008 | Harris et al. |
| 7,428,722 B2 | 9/2008 | Sunkavalli et al. |
| 7,487,131 B2 | 2/2009 | Harris et al. |
| 7,487,542 B2 | 2/2009 | Boulanger et al. |
| 7,499,464 B2 | 3/2009 | Ayrapetian et al. |
| 7,774,286 B1 | 8/2010 | Harris |
| 7,804,719 B1 | 9/2010 | Chirania et al. |
| 7,890,923 B2 | 2/2011 | Elaasar |
| 7,899,052 B1 | 3/2011 | Hao et al. |
| 7,917,684 B2 | 3/2011 | Noyes et al. |
| 7,970,964 B2 | 6/2011 | Noyes |
| 8,015,530 B1 | 9/2011 | Sinclair et al. |
| 8,020,131 B1 | 9/2011 | Van Mau et al. |
| 8,065,249 B1 | 11/2011 | Harris et al. |
| 8,140,780 B2 | 3/2012 | Noyes |
| 8,146,040 B1 | 3/2012 | Janneck et al. |
| 8,159,900 B2 | 4/2012 | Moore et al. |
| 8,209,521 B2 | 6/2012 | Noyes et al. |
| 8,239,660 B2 | 8/2012 | Cervini |
| 8,281,395 B2 | 10/2012 | Pawlowski |
| 8,294,490 B1 | 10/2012 | Kaviani |
| 8,402,188 B2 | 3/2013 | Noyes et al. |
| 8,536,896 B1 | 9/2013 | Trimberger |
| 8,593,175 B2 | 11/2013 | Noyes et al. |
| 8,648,621 B2 | 2/2014 | Noyes et al. |
| 8,680,888 B2 | 3/2014 | Brown et al. |
| 8,725,961 B2 | 5/2014 | Noyes |
| 8,782,624 B2 | 7/2014 | Brown et al. |
| 8,938,590 B2 | 1/2015 | Noyes et al. |
| 9,058,465 B2 | 6/2015 | Noyes et al. |
| 9,063,532 B2 | 6/2015 | Brown |
| 9,075,428 B2 | 7/2015 | Brown |
| 9,118,327 B2 | 8/2015 | Noyes et al. |
| 9,235,798 B2 | 1/2016 | Brown et al. |
| 2002/0186044 A1 | 12/2002 | Agrawal et al. |
| 2003/0107996 A1 | 6/2003 | Black et al. |
| 2003/0142698 A1 | 7/2003 | Parhl |
| 2003/0163615 A1 | 8/2003 | Yu |
| 2003/0226002 A1 | 12/2003 | Boutaud et al. |
| 2004/0100980 A1 | 5/2004 | Jacobs et al. |
| 2004/0125807 A1 | 7/2004 | Liu et al. |
| 2004/0151211 A1 | 8/2004 | Snider |
| 2004/0184662 A1 | 9/2004 | Kravec et al. |
| 2005/0154916 A1 | 7/2005 | Boulanger et al. |
| 2005/0251638 A1 | 11/2005 | Boutaud et al. |
| 2006/0158219 A1 | 7/2006 | Sunkavalli et al. |
| 2006/0195496 A1 | 8/2006 | Vadi et al. |
| 2006/0206875 A1 | 9/2006 | Ullmann et al. |
| 2006/0257043 A1 | 11/2006 | Chiu |
| 2006/0274001 A1 | 12/2006 | Guttag et al. |
| 2006/0288070 A1 | 12/2006 | Vadi et al. |
| 2007/0005869 A1 | 1/2007 | Balraj et al. |
| 2007/0075878 A1 | 4/2007 | Furodet et al. |
| 2007/0127482 A1 | 6/2007 | Harris et al. |
| 2007/0150623 A1 | 6/2007 | Kravec et al. |
| 2007/0282833 A1 | 12/2007 | McMillen |
| 2007/0283108 A1 | 12/2007 | Isherwood et al. |
| 2008/0126690 A1 | 5/2008 | Rajan et al. |
| 2008/0129334 A1 | 6/2008 | Sunkavalli et al. |
| 2008/0133874 A1 | 6/2008 | Capek et al. |
| 2008/0140661 A1 | 6/2008 | Pandya |
| 2008/0178031 A1 | 7/2008 | Dong-Han |
| 2008/0256347 A1 | 10/2008 | Eickemeyer et al. |
| 2008/0320053 A1 | 12/2008 | Iijima et al. |
| 2009/0198952 A1 | 8/2009 | Khmelnitsky et al. |
| 2009/0204734 A1 | 8/2009 | Strait et al. |
| 2010/0100691 A1 | 4/2010 | Noyes et al. |
| 2010/0100714 A1 | 4/2010 | Noyes et al. |
| 2010/0115173 A1 | 5/2010 | Noyes |
| 2010/0115347 A1 | 5/2010 | Noyes |
| 2010/0118425 A1 | 5/2010 | Rafaelof |
| 2010/0138432 A1 | 6/2010 | Noyes |
| 2010/0138575 A1 | 6/2010 | Noyes |
| 2010/0138634 A1 | 6/2010 | Noyes |
| 2010/0138635 A1 | 6/2010 | Noyes |
| 2010/0175130 A1 | 6/2010 | Pawlowski |
| 2010/0174887 A1 | 7/2010 | Pawlowski |
| 2010/0174929 A1 | 7/2010 | Pawlowski |
| 2010/0185647 A1 | 7/2010 | Noyes |
| 2010/0145182 A1 | 10/2010 | Schmidt et al. |
| 2010/0325352 A1 | 12/2010 | Schuette et al. |
| 2010/0332809 A1 | 12/2010 | Noyes et al. |
| 2011/0004578 A1 | 1/2011 | Momma et al. |
| 2011/0145182 A1 | 6/2011 | Dlugosch |

(56) References Cited

U.S. PATENT DOCUMENTS

| | | |
|---|---|---|
| 2011/0145544 A1 | 6/2011 | Noyes et al. |
| 2011/0161620 A1 | 6/2011 | Kaminski et al. |
| 2011/0208900 A1 | 8/2011 | Schuette et al. |
| 2011/0258360 A1 | 10/2011 | Noyes |
| 2011/0145271 A1 | 12/2011 | Noyes et al. |
| 2011/0307233 A1 | 12/2011 | Tseng et al. |
| 2011/0307433 A1 | 12/2011 | Dlugosch |
| 2011/0307503 A1 | 12/2011 | Dlugosch |
| 2011/0320759 A1 | 12/2011 | Craddock et al. |
| 2012/0192163 A1 | 6/2012 | Glendenning et al. |
| 2012/0179854 A1 | 7/2012 | Noyes |
| 2012/0192164 A1 | 7/2012 | Xu et al. |
| 2012/0192165 A1 | 7/2012 | Xu et al. |
| 2012/0192166 A1 | 7/2012 | Xu et al. |
| 2013/0156043 A1 | 6/2013 | Brown et al. |
| 2013/0159239 A1 | 6/2013 | Brown et al. |

FOREIGN PATENT DOCUMENTS

| | | |
|---|---|---|
| JP | 08087462 | 4/1996 |
| JP | 10069459 | 3/1998 |
| JP | 10111862 A | 4/1998 |
| JP | 2000231549 A | 8/2000 |
| JP | 2000347708 A | 12/2000 |
| KR | 1020080097573 A | 11/2008 |
| WO | WO0065425 A1 | 11/2000 |
| WO | WO0138978 | 5/2001 |
| WO | WO03039001 A1 | 5/2003 |
| WO | WO2005036750 A1 | 4/2005 |
| WO | WO2011114120 A1 | 9/2011 |

OTHER PUBLICATIONS

Bird, S. et al.; One-Level Phonology: Autosegmental Representations and Rules as Finite Automata; Association for Computational Linguistics; University of Edinburgh; vol. 20; No. 1; pp. 55-90; 1994.

Bispo, J. et al.; Regular Expression Matching for Reconfigurable Packet Inspection; IEEE; 2006.

Bispo, J. et al.; Synthesis of Regular Expressions Targeting FPGAs: Current Status and Open Issues; IST/INESC-ID, Libson, Portugal; pp. 1-12; 2007.

Brodie, B. et al.; A scalable Architecture for High-Throughput Regular-Expression Pattern Matching; Exegy Inc.; pp. 1-12; 2006.

Clark, C.; Design of Efficient FPGA Circuits for Matching Complex Patterns in Network Intrusion Detection Systems (Master of Science Thesis); Georgia Institute of Technology; pp. 1-56; Dec. 2003.

Clark, C.; A Unified Model of Pattern-Matching Circuits for Field-Programmable Gate Arrays [Doctoral Dissertation]; Georgia Institute of Technology; pp. 1-177; 2006.

Clark, C. et al.; Scalable Pattern Matching for High Speed Networks; Proceedings of the 12th Annual IEEE symposium on Field-Programmable Custom Computing Machines (FCCM'04); Georgia Institute of Technology; pp. 1-9; 2004.

Clark, C. et al.; A Unified Model of Pattern-Matching Circuit Architectures; Tech Report GIT-CERCS-05-20;Georgia Institute of Technology; pp. 1-17; 2005.

Fide, S.; String Processing in Hardware; Scalable Parallel and Distributed Systems Lab; Proceedings of the 12th Annual IEEE symposium on Field-Programmable Custom Computing Machines (FCCM'04);School of Electrical and Computer Engineering; Georgia Institute of Technology; pp. 1-9; 2004.

Fisk, M. et al.; Applying Fast String Matching to Intrusion Detection; Los Alamos National Laboratory; University of California San Diego; pp. 1-21; 2002.

Korenek, J.; Traffic Scanner-Hardware Accelerated Intrusion Detection System; http://www.liberouter.org/; 2006.

Kumar, S. et al.; Curing Regular Expressions matching Algorithms from Insomnia, Amnesia, and Acaluia; Department of Computer Science and Engineering; Washington University in St. Louis; pp. 1-17; Apr. 27, 2007.

Lipovski, G.; Dynamic Systolic Associative Memory Chip; IEEE; Department of Electrical and Computer Engineering; University of Texas at Austin; pp. 481-492; 1990.

Lin, C. et al.; Optimization of Pattern Matching Circuits for Regular Expression on FPGA; IEEE Transactions on Very Large Scale Integrations Systems; vol. 15, No. 12, pp. 1-6; Dec. 2007.

Schultz, K. et al.; Fully Parallel Integrated CAM/RAM Using Preclassification to Enable Large Capacities; IEEE Journal on Solid-State Circuits; vol. 31; No. 5; pp. 689-699; May 1996.

Shafai, F. et al.; Fully Parallel 30-MHz, 2.5-Mb CAM; IEEE Journal of Solid-State Circuits, vol. 33; No. 11; pp. 1690-1696; Nov. 1998.

Sidhu, R. et al.; Fast Regular Expression Pattern Matching using FPGAs; Department of EE-Systems; University of Southern California; pp. 1-12; 2001.

Wada, T.; Multiobject Behavior Recognition Event Driven Selective Attention Method; IEEE; pp. 1-16; 2000.

Yu, F.; High Speed Deep Packet Inspection with Hardware Support; Electrical Engineering and Computer Sciences; University of California at Berkeley; pp. 1-217; Nov. 22, 2006.

Freescale and Kaspersky® Accelerated Antivirus Solution Platform for OEM Vendors; Freescale Semiconductors Document; pp. 1-16; 2007.

PCT/US2009/067534 International Search Report and Written Opinion Apr. 26, 2010.

PCT/US2009/061649 International Search Report Feb. 15, 2012.

Taiwan Application No. 098144804 Office Action dated Feb. 4, 2013.

PCT/US2012/067992 International Search Report Mar. 28, 2013.

PCT/US2012/068011 International Search Report Apr. 15, 2013.

PCT/US2012/067999 International Search Report May 14, 2013.

PCT/US2012/067995 International Search Report May 17, 2013.

PCT/US2012/067988 International Search Report (Partial) Jun. 24, 2014.

PCT/US2013/049744 International Search Report and Written Opinion Oct. 22, 2013.

PCT/US2013/049748 International Search Report and Written Opinion Oct. 22, 2013.

PCT/US2013/049755 International Search Report and Written Opinion Oct. 24, 2013.

PCT/US2013/049753 International Search Report and Written Opinion Nov. 7, 2013.

PCT/US2013/055434 International Search Report and Written Opinion Nov. 11, 2013.

PCT/US2013/055438 International Search Report and Written Opinion Nov. 29, 2013.

PCT/US2013/055436 International Search Report and Written Opinion Dec. 9, 2013.

PCT/US2014/023589 International Search Report and Written Opinion Jul. 24, 2014.

Soewito et al., "Self-Addressable Memory-Based FSM: A scalable Intrusion Detection Engine", IEEE Network, pp. 14-2, Feb. 2009.

Hurson A. R.; A VLSI Design for the Parallel Finite State Automation and Its Performance Evaluation as a Hardware Scanner; International Journal of Computer and Information Sciences, vol. 13, No. 6; 1984.

Carpenter et al., "A Massively Parallel Architecture for a Self-Organizing Neural Pattern Recognition Machine", Academic Press, Inc.; 1987.

Cong et al., "Application-Specific Instruction Generation for Configurable Processor Architectures", Computer Science Department, University of California, ACM 2004.

Glette et al., "An Online EHW Pattern Recognition System Applied to Face Image Recognition", University of Oslo, Norway; 2007.

Kawai et al., "An Adaptive Pattern Recognition Hardware with On-chip Shift Register-based Partial Reconfiguration", IEEE; 2008.

Kutrib et al., "Massively Parallel Pattern Recognition with Link Features", IFIG Research Report 0003; 2000.

Marculescu et al., Power Management of Multi-Core Systems: Challenges, Approaches, and Recent Developments Tutorial at ASPLOS, London, UK [online], Mar. 4, 2012.

Vitanen et al., "Image Pattern Recognition Using Configurable Logic Cell Array", To Appear in Proc Computer Graphics International, Leeks UK; 1989.

(56) References Cited

OTHER PUBLICATIONS

Yasunaga et al., "Kernel-based Pattern Recognition Hardware: Its Design Methodology Using Evolved Truth Tables", IEEE; 2000.
U.S. Appl. No. 62/652,738, filed Feb. 12, 2005, Harris.
U.S. Appl. No. 61/788,364, filed Mar. 15, 2013, Brown et al.

\* cited by examiner ical illustration of an integrated

METHODS FOR READING DATA FROM A STORAGE BUFFER INCLUDING DELAYING ACTIVATION OF A COLUMN SELECT

CROSS-REFERENCE TO RELATED APPLICATION

Under 35 U.S.C. § 120, this application is a continuation of U.S. patent application Ser. No. 15/965,263 filed on Apr. 27, 2018, which issued as U.S. Pat. No. 11,488,645 on Nov. 1, 2022, which is a continuation of U.S. patent application Ser. No. 13/445,659 filed on Apr. 12, 2012, which is incorporated by reference herein in its entirety for all purposes.

BACKGROUND

Field of Invention

Embodiments of the invention relate generally to the field of memory devices. More specifically, embodiments of the present invention may provide one or more techniques for reading data from a storage buffer.

DESCRIPTION OF RELATED ART

Computer systems are generally employed in numerous configurations to provide a variety of computing functions. Processing speeds, system flexibility, and size constraints are typically considered by design engineers tasked with developing computer systems and system components. Computer systems generally include a plurality of memory devices which may be used to store data (e.g., programs and user data) and which may be accessible to other system components such as processors or peripheral devices. Such memory devices may include volatile and non-volatile memory devices.

Typically, a memory device, such as a synchronous dynamic random access memory (SDRAM), includes a memory array divided into a plurality of memory banks, or other divisions. Based upon addressing information received by the memory device during operation, data may be stored into and read out of appropriate banks of the memory array. For example, during operation of SDRAM, an activate (e.g., active) command may be sent to the memory array. The activate command activates a row of the memory array. Further, a column select command may be sent to the memory array. The column select command selects a column of the memory array. With the row activated and the column selected, data may be retrieved from selected memory cells of the memory array.

In certain architectures, a memory device or a portion of a memory device may be used as a storage buffer. When data is read from the storage buffer, it may be beneficial for the data to be output seamlessly (e.g., without interruption). However, in some cases, a column select of the memory device retrieves more data than is desirable. Therefore, the storage buffer may use registers to temporarily hold data before the data is output, thereby seamlessly outputting data. As will be appreciated, there may be a large number of registers. For example, the storage buffer may use 1024 or 2048 registers. Such a large number of registers may adversely affect the cost of the storage buffer. Further, a die manufactured to hold the registers may take up a significant amount of space.

Accordingly, embodiments of the present invention may be directed to one or more of the problems set forth above.

DETAILED DESCRIPTION

Some of the subsequently discussed embodiments may facilitate the manufacture of storage buffers with a limited number of registers, thereby conserving space and cost. As is described in detail below, the number of registers may be reduced by stalling column cycles during an array access. For example, a first set of data may be retrieved during a first period of time. The first set of data may be twice the amount of data that can be output during the first period of time. Therefore, following the first period of time, data retrieving may be delayed during a second period of time to allow the remaining portion of the first set of data to be output. As will be appreciated, in certain embodiments, the first period of time may be substantially similar to the second period of time. As such, the following discussion describes devices and methods in accordance with embodiments of the present technique.

Figure 1:
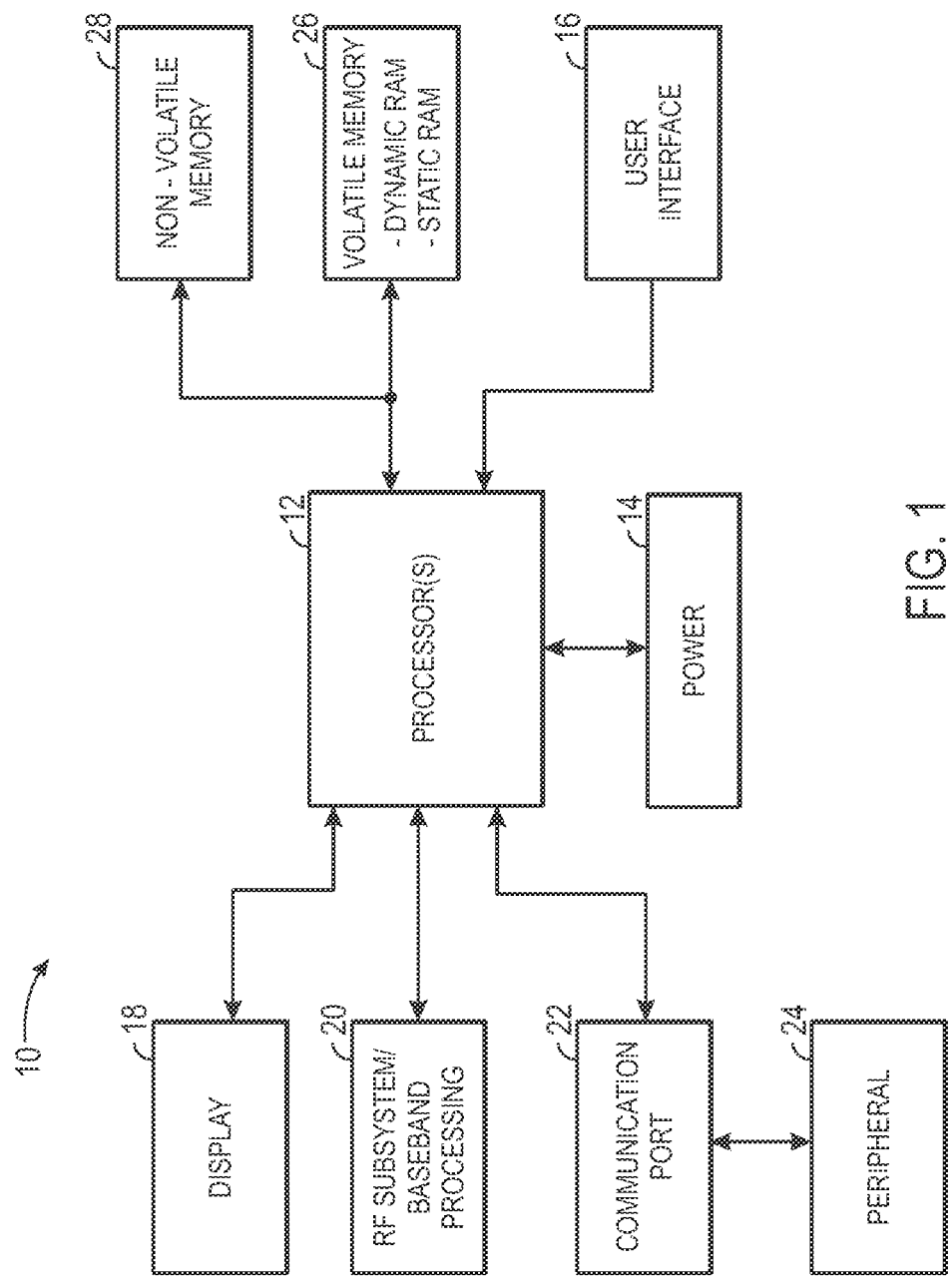
FIG. 1 illustrates a block diagram of a processor-based device in accordance with embodiments of the present invention.

Turning now to the drawings, and referring initially to FIG. 1, a block diagram depicting a processor-based system, generally designated by reference numeral 10, is illustrated. The system 10 may be any of a variety of types such as a computer, pager, cellular phone, personal organizer, control circuit, etc. In a typical processor-based device, one or more processors 12, such as a microprocessor, control the processing of system functions and requests in the system 10. As will be appreciated, the processor 12 may include an embedded North or South bridge (not shown), for coupling each of the aforementioned components thereto. Alternatively, the bridges may include separate bridges coupled between the processor 12 and the various components of the system 10.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so the system 10 may be plugged into a wall outlet, for instance. In addition, the power supply 14 may include a DC adapter such that the system 10 may be plugged into a vehicle cigarette lighter, for instance. Various other devices may be coupled to the processor 12 depending on the functions that the system 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example. In some embodiments, the display 18 may be part of the user interface 16 (e.g., touch screen tablets). Furthermore, an RF sub-system/baseband processor 20 may also be coupled to the processor 12. The RF sub-system/baseband processor 20 may include an antenna that is coupled to an RF receiver and to an RF transmitter (not shown). One or more communication ports 22 may also be coupled to the processor 12. The communication port 22 may be adapted to be coupled to one or more peripheral devices 24 such as a modem, a printer, a computer, or to a network, such as a local area network, remote area network, intranet, or the Internet, for instance.

Because the processor 12 generally controls the functioning of the system 10 by implementing software programs, memory is operably coupled to the processor 12 to store and facilitate execution of various programs. For instance, the processor 12 may be coupled to the volatile memory 26 which may include Dynamic Random Access Memory (DRAM) and/or Static Random Access Memory (SRAM). The volatile memory 26 may include a number of memory modules, such as single inline memory modules (SIMMs) or dual inline memory modules (DIMMs). As can be appreciated, the volatile memory 26 may simply be referred to as the "system memory." The volatile memory 26 is typically quite large so that it can store dynamically loaded data (e.g., applications).

The processor(s) 12 may also be coupled to non-volatile memory 28. The non-volatile memory 28 may include a read-only memory (ROM), such as an EPROM, and/or flash memory to be used in conjunction with the volatile memory. The size of the ROM is typically selected to be just large enough to store any necessary operating system, application programs, and fixed data. Additionally, the non-volatile memory 28 may include a high capacity memory such as a tape or disk drive memory. As will be appreciated, the volatile memory 26, or the non-volatile memory 28 may be considered a non-transitory tangible machine-readable medium for storing code (e.g., instructions).

Figure 2:
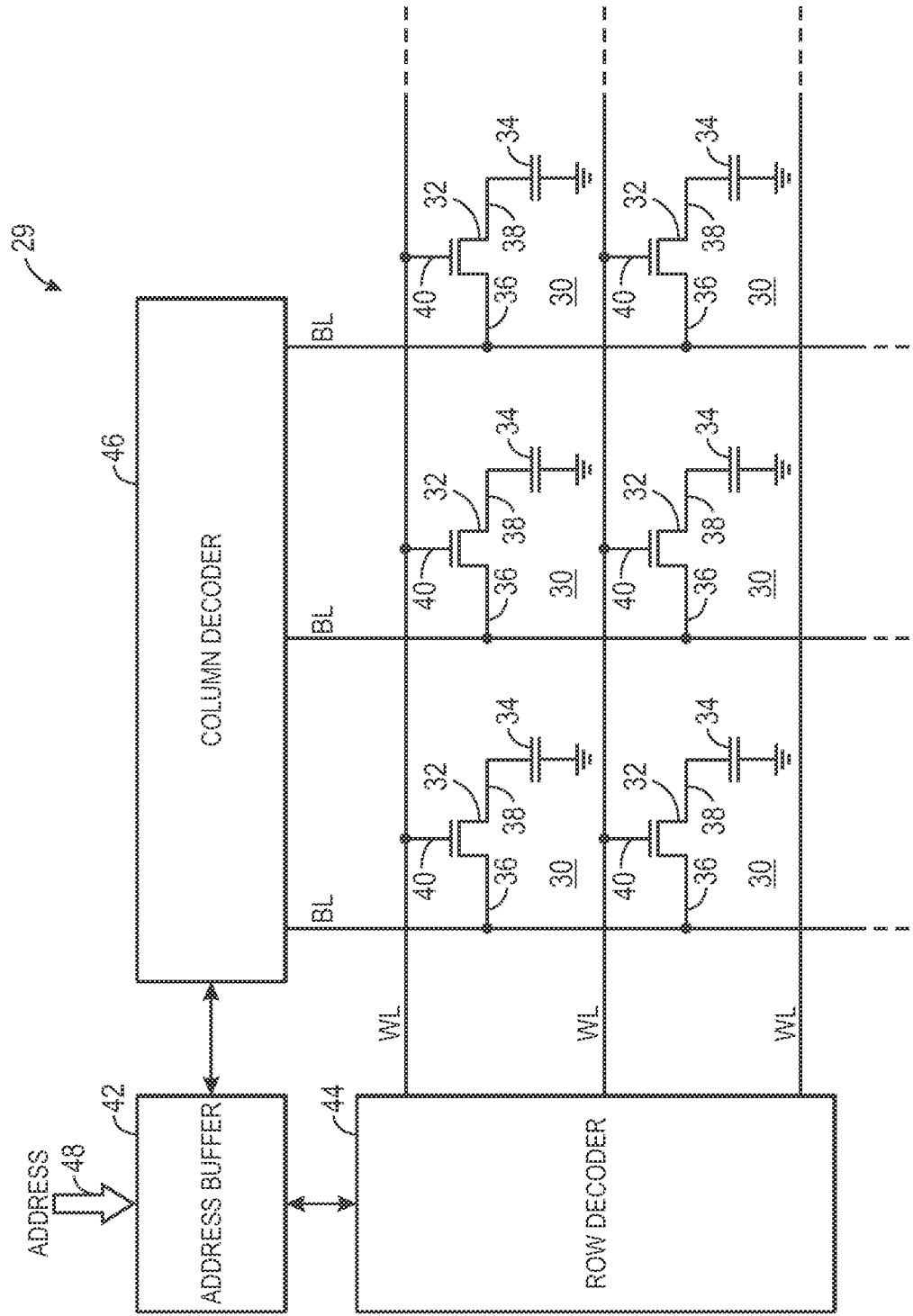
FIG. 2 is a partial schematic illustration of an integrated circuit, incorporating an array of memory cells fabricated in accordance with embodiments of the present invention.
Figure 3:
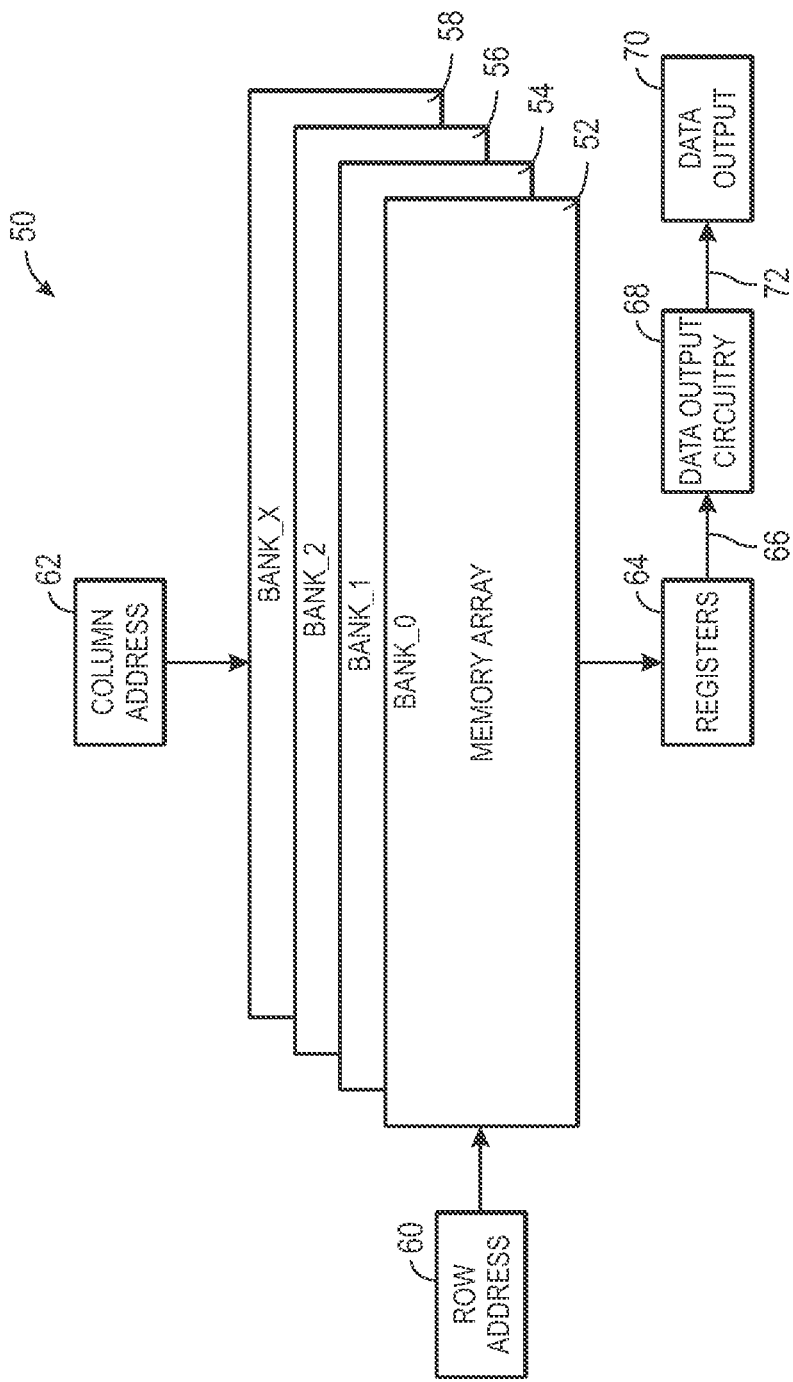
FIG. 3 illustrates a partial functional block diagram of an architecture of a storage buffer in accordance with embodiments of the present invention.
Figure 4:
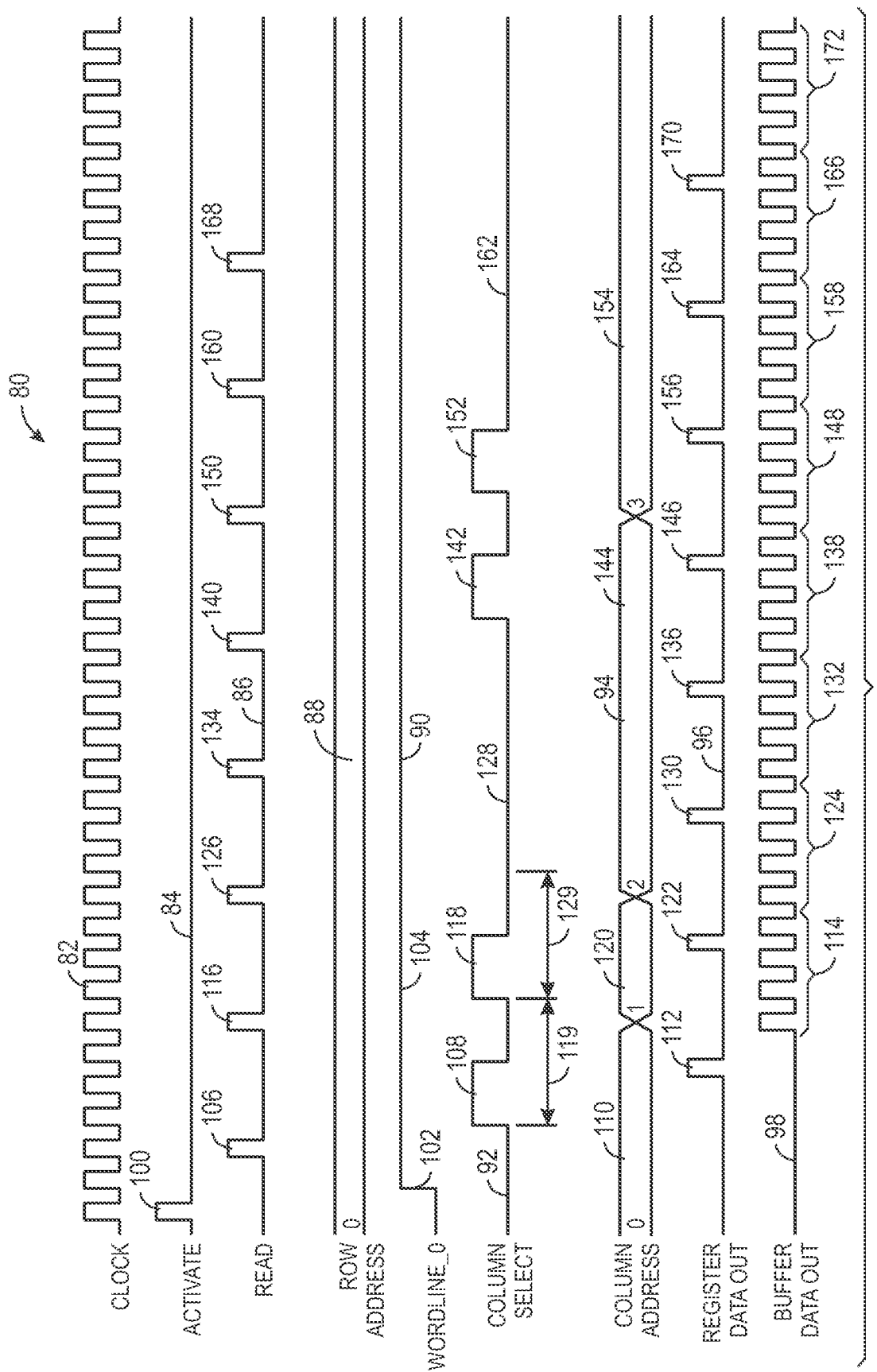
FIG. 4 illustrates a timing diagram of data retrieval from a storage buffer in accordance with embodiments of the present invention.
Figure 5:
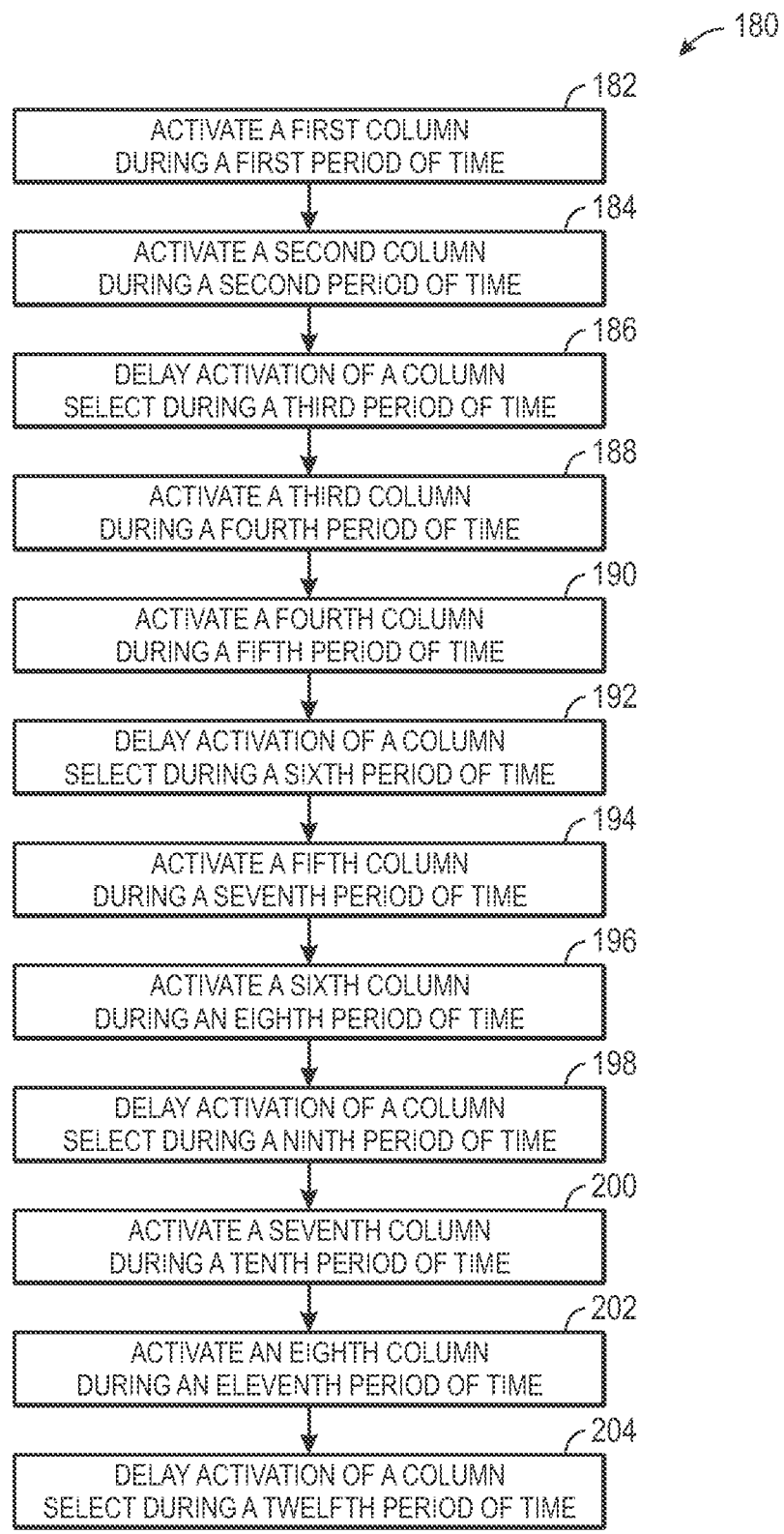
FIG. 5 illustrates a flowchart of a method for reading data from a storage buffer in accordance with embodiments of the present invention.

One or more components of the system 10 may include a storage buffer that functions in accordance with embodiments described herein. Some examples of devices that may be part of a storage buffer are illustrated in FIGS. 2-3. Specifically, FIG. 2 illustrates an array of memory cells that may be part of the storage buffer, and FIG. 3 illustrates a functional block diagram that may be associated with the architecture of the storage buffer. FIGS. 4-5 describe the timing of signals of the storage buffer and methods of operating the storage buffer.

Referring now to FIG. 2, a partial schematic illustration of an integrated circuit, such as a memory device 29, which may be implemented in the volatile memory 26, is illustrated. The memory device 29 includes an array of memory cells which may be part of a storage buffer operating in accordance with the techniques described herein. In some embodiments, the memory device 29 may comprise a dynamic random access memory (DRAM) device. The memory device 29 includes a number of memory cells 30 arranged in a grid pattern and comprising a number of rows and columns. The number of memory cells 30 (and corresponding rows and columns) may vary depending on system requirements and fabrication technology. Each memory cell 30 may include an access device (e.g., a MOSFET 32), and a storage device (e.g., a capacitor 34). In certain embodiments, the memory cell 30 may not include an access device (e.g., some cross-point memories). In other embodiments, the memory cell 30 may include an access device that is part of its storage device (e.g., 1T0C devices, such as floating body devices). The MOSFET 32 includes a drain terminal 36, a source terminal 38, and a gate 40. The capacitor 34 is coupled to the source terminal 38. The terminal of the capacitor 34 that is not coupled to the MOSFET 32 may be coupled to a ground plane. As described further below, the drain 36 is coupled to a bit line (BL) and the gate 40 is coupled to a word line (WL).

It should be noted that although the above description depicts the terminal of the access device coupled to the capacitor 34 as the "source" 38 and the other non-gate terminal of the access device as the "drain" 36, during read and write operations, the MOSFET 32 may be operated such that each of the terminals 36 and 38 operates at one time or another as a source or a drain. Accordingly, for purposes of further discussion it should be recognized that whenever a terminal is identified as a "source" or a "drain," it is only for convenience and that in fact during operation of the MOSFET 32 either terminal could be a source or a drain depending on the manner in which the MOSFET 32 is being controlled by the voltages applied to the terminals 36, 38 and 40. In addition, it will be appreciated that embodiments of a memory device 29 may include p-type MOSFETs, n-type MOSFETs, or a combination of both.

As previously described, the memory array is arranged in a series of rows and columns. To implement the data storage capabilities of a memory cell 30, an electrical charge is placed on the drain 36 of the MOSFET 32 via a bit line (BL). By controlling the voltage at the gate 40 via the word line (WL), the depletion region between the gate 40 and the channel may be narrowed such that the electrical charge at the drain 36 can flow to the capacitor 34. By storing electrical charge in the capacitor 34, the charge may be interpreted as a binary data value in the memory cell 30. For instance, for a single-bit storage device, a positive charge above a known threshold voltage stored in the capacitor 34 may be interpreted as binary "1." If the charge in the capacitor 34 is below the threshold value, a binary value of "0" is said to be stored in the memory cell 30.

The bit lines BL are used to read and write data to and from the memory cells 30. The word lines WL are used to activate the MOSFET 32 to access a particular row of memory cells 30. Accordingly, the memory device 29 also includes a periphery portion which may include an address buffer 42, row decoder 44 and column decoder 46. The row decoder 44 and column decoder 46 selectively access the memory cells 30 in response to address signals that are provided on the address bus 48 during read, write, and refresh operations. The address signals are typically provided by an external controller such as a microprocessor, or another type of memory controller, but in some embodiment the address signals may be internally generated. The column decoder 46 may also include sense amplifiers and input/output circuitry to further facilitate the transfer of data to and from the memory cells 30 via the bit lines BL.

In one mode of operation, the memory device 29 receives the address of a particular memory cell(s) 30 at the address buffer 42. The address buffer 42 passes the address to the row decoder 44. The row decoder 44 selectively activates the particular word line WL identified by the address to activate the MOSFET's 32 of each memory cell 30 that is connected to the selected word line WL. The column decoder 46 selects the bit line (or bit lines) BL of the memory cell(s) 30 corresponding to the address. For a write operation, data received by the input/output circuitry is coupled to the selected bit line (or bit lines) BL and provides for the charge or discharge of the capacitor 34 of the selected memory cell(s) 30 through the activated MOSFET 32. The charge typically corresponds to binary data, as previously described. For a read operation, data stored in the selected memory cell(s) 30, represented by the charge stored in the capacitor(s) 34, is coupled to the select bit line (or bit lines) BL, amplified by the sense amplifier and a corresponding voltage level is provided to the input/output circuitry in the column decoder 46.

As described below, a memory device 29 may be part of a storage buffer operating in accordance with the techniques described herein and may have a smaller die size than other storage buffers. For example, memory device 29 may be part of a storage buffer that includes a limited number of registers. Furthermore, because the storage buffer includes a limited number of registers, the cost to manufacture the storage buffer may be reduced.

Referring now to FIG. 3, a partial functional block diagram of an architecture of a storage buffer 50 is illustrated. The storage buffer 50 includes multiple memory banks 52, 54, 56, and 58. In certain embodiments, the storage buffer 50 may include sixteen memory banks (e.g., in an ×16 configuration). As will be appreciated, each of the memory banks 52, 54, 56, and 58 includes a memory array having a plurality of memory cells 30. Furthermore, each of the memory banks 52, 54, 56, and 58 may be coupled to sense amplifiers for amplifying data read from the memory banks. It should be noted that in certain embodiments, the storage buffer 50 may be only a portion of another memory device. A row address 60 is used to select a row (e.g., activate a word line) of the storage buffer 50, thereby activating a certain number of memory cells 30 for performing a read and/or write operation. For example, activating a word line may activate 2048 memory cells 30 for performing a read operation. Further, a column address 62 is used to select a column (e.g., one or more bit lines) of the storage buffer 50 for writing data to and/or reading data from the memory cells 30. It should be noted that selecting one or more bit lines of the storage buffer 50 may select multiple memory cells 30 for reading and/or writing concurrently. For example, selecting one or more bit lines may select 256 memory cells 30 to be concurrently read from. In certain embodiments, the row address 60 or column address 62 may be used to select one of the memory banks 52, 54, 56, and 58 to be accessed. In other embodiments, a separate bank address may be used to select one of the memory banks 52, 54, 56, and 58 to be accessed.

During a memory read, data may be transferred from the memory banks 52, 54, 56, and 58 to registers 64. The registers 64 may include any number of data storage locations (e.g., latches, etc.) for temporarily storing data. For example, the registers 64 may include approximately 384 data storage locations. Data may be transferred from the registers 64 via a data bus 66 to data output circuitry 68 which conditions the data for being output from the storage buffer 50. In certain embodiments, the data bus 66 may be a 128 bit data bus for concurrently transferring 128 bits from the registers 64. The data output circuitry 68 provides a data output 70 via data nodes (e.g., pins) 72 (e.g., DQ(15:0)). Therefore, the data output circuitry 68 is limited to outputting data based on the number of output data nodes 72. For example, in a storage buffer 50 with 16 data nodes, 16 bits of data may be output at a time.

Using the storage buffer 50 as described above, data may be output from the storage buffer 50 seamlessly. For example, when a read request is made to the storage buffer 50, data may be transferred out via the output data nodes 72 without interruptions. Further, the storage buffer 50 may be designed to include a limited number of registers to reduce manufacturing cost and to obtain a limited die size. In certain embodiments, the storage buffer 50 may be designed to completely eliminate the registers 64.

Turning to FIG. 4, a timing diagram 80 of data retrieval from the storage buffer 50 is illustrated. The timing diagram 80 includes timing relating to a clock 82, an activate command 84, a read command 86, a row address 88, a wordline_0 90, a column select 92, a column address 94, a register data out 96, and a buffer data out 98. The clock 82 provides a timing signal to synchronize the operations of the storage buffer 50. As illustrated, the clock 82 consistently provides an alternating signal (e.g., logic low, logic high, logic low, logic high, etc.) during operation of the storage buffer 50. The clock 82 may operate at any suitable frequency. For example, the clock 82 may operate at 500 MHz, 750 MHz, 800 MHz, 1.000 GHz, 1.150 GHz, 1.500 GHz, and so forth.

The activate command 84 is used to activate (e.g., open) a row of memory cells 30 in the storage buffer 50. In certain embodiments, the activate command 84 may activate the row of memory cells 30 within a selected bank of the storage buffer 50. A pulse 100 illustrates the activate command 84 being applied to the storage buffer 50. At the time the pulse 100 is applied, the row address 88 is set to "0." Therefore, wordline_0 90 is activated and transitions at a time 102 to a logic high 104. Accordingly, wordline_0 90 is activated from the time 102 through the remaining time shown in the timing diagram 80. As such, the wordline_0 90 is activated for performing read and/or write operations. As will be appreciated, the wordline_0 90 may activate a specific number of memory cells 30 that corresponds to the particular architecture of the storage buffer 50. For example, the wordline_0 90 may activate 2048 memory cells 30.

The read command 86 is used to retrieve data from a selected column of memory cells 30 in the storage buffer 50. A pulse 106 illustrates the read command 86 being applied to the storage buffer 50. After the pulse 106 is issued, the column select 92 transitions to a logic high as illustrated by a pulse 108. While the pulse 108 is applied, the column address 94 is set to "0" (e.g., segment 110). Therefore, data is transferred from row "0," column "0" of the storage buffer 50 into the registers 64. In certain embodiments, with a single column select 92, 256 bits of data are transferred into the registers 64. Data is then transferred out of the registers 64 to the data output circuitry 68 responsive to a pulse 112 of the register data out 96. As will be appreciated, data may be transferred out of the registers 64 at a rate that is less than (e.g., half) the rate that data is transferred into the registers 64. For example, data may be transferred out of the registers 64 (e.g., data output rate) in sets of 128 bits over a period of time of approximately 3.5 ns (e.g., 4.57 GB/s), while data may be transferred into the registers 64 (e.g., retrieval rate) in sets of 256 bits over a period of time of approximately 3.5 ns (e.g., 9.14 GB/s). The data may be transferred out of the registers 64 to the data output circuitry 68 using the data bus 66 (e.g., 128 bit data bus). A series of pulses 114 illustrate data being output from the data output circuitry 68 onto data nodes (e.g., output data nodes 72). As discussed above, data may be output 16 bits at a time. For example, the series of pulses 114 includes four pulses. Data may be output onto the 16 output data nodes 72 with each rising edge (i.e., four times) and each falling edge (i.e., four times) of the series of pulses 114. Thus, 128 bits of data may be output during the series of pulses 114 (i.e., 16×8=128). Accordingly, during the series of pulses 114, the data from the data output circuitry 68 will be output from the storage buffer 50 onto the output data nodes 72.

A pulse 116 illustrates the read command 86 again being applied to the storage buffer 50. After the pulse 116 is issued, the column select 92 transitions to a logic high as illustrated by a pulse 118. It should be noted that, in certain embodiments, the time from the rising edge of the pulse 108 to the rising edge of the pulse 118 (e.g., array cycle time 119) may be approximately 3.5 ns. Likewise, the time from the falling edge of the pulse 108 to the falling edge of the pulse 118 may be approximately 3.5 ns. In other embodiments, the array cycle time 119 may be 2 ns, 4 ns, 5 ns, 10 ns, and so forth. While the pulse 118 is applied, the column address 94 is set to "1" (e.g., segment 120). Therefore, data is transferred from row "0," column "1" of the storage buffer 50 into the registers 64.

As will be appreciated, just prior to the pulse 118, the registers 64 may contain approximately half of the data transferred from row "0," column "0" of the storage buffer 50. For example, if 256 bits of data were transferred from row "0," column "0" into the registers 64, only 128 bits of data may remain in the registers 64 due to 128 bits of data being transferred from the registers 64 to the data output circuitry 68 responsive to pulse 112. Therefore, the registers 64 may have 256 available temporary storage locations to store the data transferred from row "0," column "1." Accordingly, the registers 64 may include one and a half times the amount of storage locations that are used for transferring data from a single column of a row (e.g., 1.5×256=384). Data is transferred out of the registers 64 to the data output circuitry 68 responsive to a pulse 122 of the register data out 96. A series of pulses 124 illustrate data again being output from the data output circuitry 68 onto data nodes (e.g., output data nodes 72). Accordingly, during the series of pulses 124, the data from the data output circuitry 68 will be output from the storage buffer 50 onto the output data nodes 72.

Furthermore, a pulse 126 illustrates the read command 86 again being applied to the storage buffer 50. After the pulse 126 is issued, the column select 92 does not transition, as illustrated by a segment 128. In certain embodiments, the column select 92 may not transition for a total of two array cycle times beyond an array cycle time 129 that includes pulse 118 (e.g., the array cycle time 129 may be approximately twice the time of the pulse 118). For example, during segment 128, the column select 92 may not transition for 7.0 ns after the array cycle time 129, or 8.75 ns after the pulse 118. In other embodiments, the column select 92 may not transition for 4 ns, 8 ns, 10 ns, 20 ns, and so forth, after the array cycle time 129. With the column select 92 not transitioning during the segment 128, no data is transferred from the storage buffer 50 into the registers 64. Thus, during the segment 128, the registers 64 are able to transfer out any remaining data stored thereon. Accordingly, data is transferred out of the registers 64 to the data output circuitry 68 responsive to a pulse 130 of the register data out 96. A series of pulses 132 illustrate data again being output from the data output circuitry 68 onto data nodes (e.g., output data nodes 72). Therefore, during the series of pulses 132, the data from the data output circuitry 68 will be output from the storage buffer 50 onto the output data nodes 72.

Likewise, a pulse 134 illustrates the read command 86 again being applied to the storage buffer 50. After the pulse 134 is issued, the column select 92 again does not transition, as illustrated by the segment 128. Accordingly, data is transferred out of the registers 64 to the data output circuitry 68 responsive to a pulse 136 of the register data out 96. A series of pulses 138 illustrate data again being output from the data output circuitry 68 onto data nodes (e.g., output data nodes 72). Therefore, during the series of pulses 138, the data from the data output circuitry 68 will be output from the storage buffer 50 onto the output data nodes 72.

A pulse 140 illustrates the read command 86 again being applied to the storage buffer 50. This read command 86 initiates a repetition of the cycle that started with the pulse 106. After the pulse 140 is issued, the column select 92 transitions to a logic high as illustrated by a pulse 142. While the pulse 142 is applied, the column address 94 is set to "2" (e.g., segment 144). Therefore, data is transferred from row "0," column "2" of the storage buffer 50 into the registers 64. Data is then transferred out of the registers 64 to the data output circuitry 68 responsive to a pulse 146 of the register data out 96. A series of pulses 148 illustrate data being output from the data output circuitry 68 onto data nodes (e.g., output data nodes 72). Accordingly, during the series of pulses 148, the data from the data output circuitry 68 will be output from the storage buffer 50 onto the output data nodes 72.

Furthermore, a pulse 150 illustrates the read command 86 again being applied to the storage buffer 50. After the pulse 150 is issued, the column select 92 transitions to a logic high as illustrated by a pulse 152. While the pulse 152 is applied, the column address 94 is set to "3" (e.g., segment 154). Therefore, data is transferred from row "0," column "3" of the storage buffer 50 into the registers 64. Data is then transferred out of the registers 64 to the data output circuitry 68 responsive to a pulse 156 of the register data out 96. A series of pulses 158 illustrate data again being output from the data output circuitry 68 onto data nodes (e.g., output data nodes 72). Accordingly, during the series of pulses 158, the data from the data output circuitry 68 will be output from the storage buffer 50 onto the output data nodes 72.

A pulse 160 illustrates the read command 86 again being applied to the storage buffer 50. After the pulse 160 is issued, the column select 92 does not transition, as illustrated by a segment 162. In certain embodiments, the column select 92 may not transition for a total of two array cycle times beyond an array cycle time (e.g., approximately 3.5 ns) that includes pulse 152. For example, during segment 162, the column select 92 may not transition for 7.0 ns after the array cycle time that includes pulse 152, or 8.75 ns after the pulse 152. With the column select 92 not transitioning during the segment 162, no data is transferred from the storage buffer 50 into the registers 64. Thus, during the segment 162, the registers 64 are able to transfer out any remaining data. Accordingly, data is transferred out of the registers 64 to the data output circuitry 68 responsive to a pulse 164 of the register data out 96. A series of pulses 166 illustrate data again being output from the data output circuitry 68 onto data nodes (e.g., output data nodes 72). Therefore, during the series of pulses 166, the data from the data output circuitry 68 will be output from the storage buffer 50 onto the output data nodes 72.

Likewise, a pulse 168 illustrates the read command 86 again being applied to the storage buffer 50. After the pulse 168 is issued, the column select 92 again does not transition, as illustrated by the segment 162. Accordingly, data is transferred out of the registers 64 to the data output circuitry 68 responsive to a pulse 170 of the register data out 96. A series of pulses 172 illustrate data again being output from the data output circuitry 68 onto data nodes (e.g., output data nodes 72). Therefore, during the series of pulses 172, the data from the data output circuitry 68 will be output from the storage buffer 50 onto the output data nodes 72.

As described above, data may be read from the storage buffer 50 by activating a first column select followed by activating a second column select (e.g., this may take a total of approximately 7.0 ns). Because data is retrieved from the columns at twice the rate that data is transferred out of the storage buffer 50, no column select is applied for two array cycle times (e.g., approximately 7.0 ns). This pattern is then repeated until all data is read out of a particular word line of the storage buffer 50. For example, the timing diagram 80 as illustrated may read out approximately 1024 bits of data over a time period of approximately 28 ns. In certain embodiments, the timing diagram 80 may represent timing for outputting only half of the data from wordline_0 90. In such an embodiment, the timing diagram 80 may be repeated for more columns (e.g., data may be transferred from columns 4 through 7 in a similar manner as described above). As such, the storage buffer 50 may output approximately 2048 bits of data over a time period of approximately 56 ns. Further, the same method may be repeated with each word line. Using such a method, data may be seamlessly output from the storage buffer 50. Further, die space for the storage buffer 50 may be minimized enabling the storage buffer 50 to be manufactured at a lower cost than other storage buffers.

As will be appreciated, in certain embodiments (e.g., an ×4 configuration), data may be read from the storage buffer 50 at four times the rate that data is transferred out of the storage buffer 50. Accordingly, data may be read from the storage buffer 50 by activating a first column select followed by activating a second column select. To transfer all of the data read out of the storage buffer 50 during the first and second column selects, no column select may be applied for four array cycle times. Furthermore, the same pattern of reading data and delaying column selects may be applied to any type of storage buffer 50 configuration.

Referring now to FIG. 5, a flowchart of a method 180 for retrieving (e.g., fetching) data from a storage buffer 50 is illustrated. At block 182, a first column select is activated during a first period of time to retrieve a first set of data. As will be appreciated, the first period of time may include the time it takes for a full array cycle, including activating and deactivating the first column select. For example, the first period of time may be approximately 3.5 ns (e.g., 1.75 ns activated and 1.75 ns deactivated). Further, the first set of data may be data including any number of bits. For example, the first set of data may include 256 bits.

Next, at block 184, a second column select is activated during a second period of time to retrieve a second set of data. Again, as will be appreciated, the second period of time may include the time it takes for a full array cycle, including activating and deactivating the second column select. For example, the second period of time may be approximately 3.5 ns (e.g., 1.75 ns activated and 1.75 ns deactivated). Further, the second set of data may be data including any number of bits. For example, the second set of data may include 256 bits.

Then, at block 186, activation of a column select is delayed during a third period of time to inhibit additional data retrieval (e.g., to allow the first and second sets of data to be output from the storage buffer 50). It should be noted that the third period of time may be substantially the same as a sum of the first period of time and the second period of time. For example, if the first period of time is approximately 3.5 ns and the second period of time is approximately 3.5 ns, the third period of time may be approximately 7.0 ns.

At block 188, a third column select is activated during a fourth period of time to retrieve a third set of data. Next, at block 190, a fourth column select is activated during a fifth period of time to retrieve a fourth set of data. Then, at block 192, activation of a column select is delayed during a sixth period of time to inhibit additional data retrieval (e.g., to allow the third and fourth sets of data to be output from the storage buffer 50).

Furthermore, at block 194, a fifth column select is activated during a seventh period of time to retrieve a fifth set of data. Next, at block 196, a sixth column select is activated during an eighth period of time to retrieve a sixth set of data. Then, at block 198, activation of a column select is delayed during a ninth period of time to inhibit additional data retrieval (e.g., to allow the fifth and sixth sets of data to be output from the storage buffer 50).

In addition, at block 200, a seventh column select is activated during a tenth period of time to retrieve a seventh set of data. Next, at block 202, an eighth column select is activated during an eleventh period of time to retrieve an eighth set of data. Then, at block 204, activation of a column select is delayed during a twelfth period of time to inhibit additional data retrieval (e.g., to allow the seventh and eighth sets of data to be output from the storage buffer 50).

As will be appreciated, a sum of the twelve periods of time may be a total time that it takes to retrieve all of the data from a word line (e.g., wordline_0 90). In certain embodiments, the sum of the twelve periods of time may be approximately 56 ns. In other embodiments, the sum of the twelve period of time may be less than or greater than 56 ns. When data is retrieved from the word line, the storage buffer 50 may be precharged during a period of time (e.g., to be ready to retrieve data from another word line). Further, some embodiments, may only include blocks 182 through 186, while other embodiments may only include blocks 182 through 192. It should be noted that the method 180 may include fewer or more blocks than illustrated.

Using the method 180 described above, data may be retrieved from the storage buffer 50 at a retrieval rate that is greater than the output rate of the storage buffer 50. As such, the retrieval of data from the storage buffer 50 may be delayed to allow the output of the storage buffer 50 time to output the data. As will be appreciated, the ideas presented above may be applied to any mismatch between the retrieval rate and the output rate of the storage buffer 50 in order to provide for seamless data output from the storage buffer 50. Further, the storage buffer 50 provides the seamless data output with few registers which allows the storage buffer 50 to be manufactured at a lower cost than other storage buffers.

Figure 6:
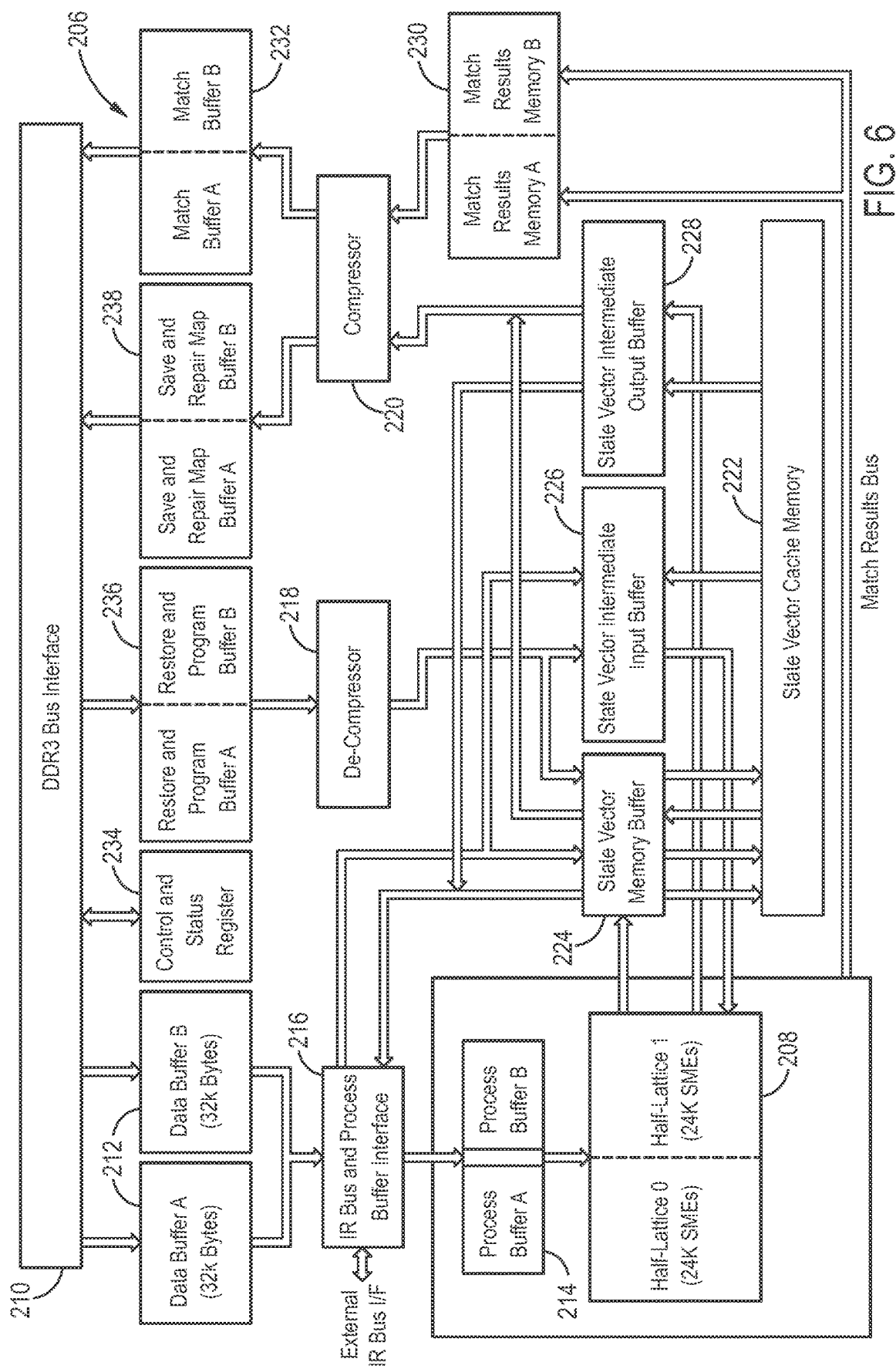
FIG. 6 illustrates a block diagram of a state machine engine that may include a storage buffer in accordance with embodiments of the present invention.

The storage buffer 50 as described in the present application may be used in a variety of different applications. For example, the storage buffer 50 may be used in a state machine engine 206 illustrated in FIG. 6, which may operate under control of the processor 12 of FIG. 1. The state machine engine 206 may employ any one of a number of state machine architectures, including, but not limited to Mealy architectures, Moore architectures, Finite State Machines (FSMs), Deterministic FSMs (DFSMs), Bit-Parallel State Machines (BPSMs), etc. Though a variety of architectures may be used, for discussion purposes, this application refers to FSMs. However, those skilled in the art will appreciate that the described techniques may be employed using any one of a variety of state machine architectures.

As discussed further below, the state machine engine 206 may include a number of (e.g., one or more) finite state machine (FSM) lattices 208. Each FSM lattice 208 may include multiple FSMs that each receive and analyze the same data in parallel. Further, the FSM lattices 208 may be arranged in groups (e.g., clusters), such that clusters of FSM lattices 208 may analyze the same input data in parallel. Further, clusters of FSM lattices 208 of the state machine engine 206 may be arranged in a hierarchical structure wherein outputs from state machine lattices 208 on a lower level of the hierarchical structure may be used as inputs to state machine lattices 208 on a higher level. By cascading clusters of parallel FSM lattices 208 of the state machine engine 206 in series through the hierarchical structure, increasingly complex patterns may be analyzed (e.g., evaluated, searched, etc.).

Further, based on the hierarchical parallel configuration of the state machine engine 206, the state machine engine 206 can be employed for pattern recognition in systems that utilize high processing speeds. For instance, embodiments described herein may be incorporated in systems with processing speeds of 1 GByte/sec. Accordingly, utilizing the state machine engine 206, data from high speed memory devices or other external devices may be rapidly analyzed for various patterns. The state machine engine 206 may analyze a data stream according to several criteria, and their respective search terms, at about the same time, e.g., during a single device cycle. Each of the FSM lattices 208 within a cluster of FSMs on a level of the state machine engine 206 may each receive the same search term from the data stream at about the same time, and each of the parallel FSM lattices 208 may determine whether the term advances the state machine engine 206 to the next state in the processing criterion. The state machine engine 206 may analyze terms according to a relatively large number of criteria, e.g., more than 100, more than 110, or more than 10,000. Because they operate in parallel, they may apply the criteria to a data stream having a relatively high bandwidth, e.g., a data stream of greater than or generally equal to 1 GByte/sec, without slowing the data stream.

In one embodiment, the state machine engine 206 may be configured to recognize (e.g., detect) a great number of patterns in a data stream. For instance, the state machine engine 206 may be utilized to detect a pattern in one or more of a variety of types of data streams that a user or other entity might wish to analyze. For example, the state machine engine 206 may be configured to analyze a stream of data received over a network, such as packets received over the Internet or voice or data received over a cellular network. In one example, the state machine engine 206 may be configured to analyze a data stream for spam or malware. The data stream may be received as a serial data stream, in which the data is received in an order that has meaning, such as in a temporally, lexically, or semantically significant order. Alternatively, the data stream may be received in parallel or out of order and, then, converted into a serial data stream, e.g., by reordering packets received over the Internet. In some embodiments, the data stream may present terms serially, but the bits expressing each of the terms may be received in parallel. The data stream may be received from a source external to the system 10, or may be formed by interrogating a memory device, such as the volatile memory 26 or non-volatile memory 28, and forming the data stream from data stored in the memory 26, 28. In other examples, the state machine engine 206 may be configured to recognize a sequence of characters that spell a certain word, a sequence of genetic base pairs that specify a gene, a sequence of bits in a picture or video file that form a portion of an image, a sequence of bits in an executable file that form a part of a program, or a sequence of bits in an audio file that form a part of a song or a spoken phrase. The stream of data to be analyzed may include multiple bits of data in a binary format or other formats, e.g., base ten, ASCII, etc. The stream may encode the data with a single digit or multiple digits, e.g., several binary digits.

In an example, the FSM lattice 208 comprises an array of blocks. Each block may include a plurality of selectively couple-able hardware elements (e.g., programmable elements and/or special purpose elements) that correspond to a plurality of states in a FSM. Similar to a state in a FSM, a hardware element can analyze an input stream and activate a downstream hardware element, based on the input stream.

The programmable elements can be programmed to implement many different functions. For instance, the programmable elements may include state machine elements (SMEs) that are hierarchically organized into rows and blocks. To route signals between the hierarchically organized SMEs, a hierarchy of programmable switching elements can be used, including inter-block switching elements, intra-block switching elements, and intra-row switching elements. The switching elements may include routing structures and buffers. An SME can correspond to a state of a FSM implemented by the FSM lattice 208. Accordingly, a FSM can be implemented on the FSM lattice 208 by programming the SMEs to correspond to the functions of states and by selectively coupling together the SMEs to correspond to the transitions between states in the FSM.

As previously described, the state machine engine 206 is configured to receive data from a source, such as the volatile memory 26 and/or the non-volatile 28, over a data bus. In the illustrated embodiment, data may be sent to the state machine engine 206 through a bus interface, such as a DDR3 bus interface 210. The DDR3 bus interface 210 may be capable of exchanging data at a rate greater than or equal to 1 GByte/sec. As will be appreciated, depending on the source of the data to be analyzed, the bus interface 210 may be any suitable bus interface for exchanging data to and from a data source to the state machine engine 206, such as a NAND Flash interface, PCI interface, etc. As previously described, the state machine engine 206 includes one or more FSM lattices 208 configured to analyze data. Each FSM lattice 208 may be divided into two half-lattices. In the illustrated embodiment, each half lattice may include 24K SMEs, such that the lattice 208 includes 48K SMEs. The lattice 208 may comprise any desirable number of SMEs. Further, while only one FSM lattice 208 is illustrated, the state machine engine 206 may include multiple FSM lattices 208, as previously described.

Data to be analyzed may be received at the bus interface 210 and transmitted to the FSM lattice 208 through a number of buffers and buffer interfaces. In the illustrated embodiment, the data path includes data buffers 212, process buffers 214 and an inter-rank (IR) bus and process buffer interface 216. The data buffers 212 are configured to receive and temporarily store data to be analyzed. In one embodiment, there are two data buffers 212 (data buffer A and data buffer B). Data may be stored in one of the two data buffers 212, while data is being emptied from the other data buffer 212, for analysis by the FSM lattice 208. In the illustrated embodiment, the data buffers 212 may be 32 KBytes each. The IR bus and process buffer interface 216 may facilitate the transfer of data to the process buffer 214. The IR bus and process buffer 216 ensures that data is processed by the FSM lattice 208 in order. The IR bus and process buffer 216 may coordinate the exchange of data, timing information, packing instructions, etc. such that data is received and analyzed in the correct order. Generally, the IR bus and process buffer 216 allows the analyzing of multiple data sets in parallel through logical ranks of FSM lattices 208.

In the illustrated embodiment, the state machine engine 206 also includes a de-compressor 218 and a compressor 220 to aid in the transfer of the large amounts of data through the state machine engine 206. The compressor 220 and de-compressor 218 work in conjunction such that data can be compressed to minimize the data transfer times. By compressing the data to be analyzed, the bus utilization time may be minimized. In certain embodiments, a mask may be provided to the state machine engine 206 to provide information on which state machines are likely to be unused. The compressor 220 and de-compressor 218 can also be configured to handle data of varying burst lengths. By padding compressed data and including an indicator as to when each compressed region ends, the compressor 220 may improve the overall processing speed through the state machine engine 206. The compressor 220 and de-compressor 218 may also be used to compress and decompress match results data after analysis by the FSM lattice 208.

As previously described, the output of the FSM lattice 208 can comprise a state vector. The state vector comprises the state (e.g., activated or not activated) of programmable elements of the FSM lattice 208. Each state vector may be temporarily stored in the state vector cache memory 222 for further hierarchical processing and analysis. That is, the state of each state machine may be stored, such that the final state may be used in further analysis, while freeing the state machines for reprogramming and/or further analysis of a new data set. Like a typical cache, the state vector cache memory 222 allows storage of information, here state vectors, for quick retrieval and use, here by the FSM lattice 208, for instance. Additional buffers, such as the state vector memory buffer 224, state vector intermediate input buffer 226, and state vector intermediate output buffer 228, may be utilized in conjunction with the state vector cache memory 222 to accommodate rapid analysis and storage of state vectors, while adhering to packet transmission protocol through the state machine engine 206.

Once a result of interest is produced by the FSM lattice 208, match results may be stored in a match results memory 230. That is, a "match vector" indicating a match (e.g., detection of a pattern of interest) may be stored in the match results memory 230. The match result can then be sent to a match buffer 232 for transmission over the bus interface 210 to the processor 12, for example. As previously described, the match results may be compressed.

Additional registers and buffers may be provided in the state machine engine 206, as well. For instance, the state machine engine 206 may include control and status registers 234. In addition, restore and program buffers 236 may be provided for using in programming the FSM lattice 208 initially, or restoring the state of the machines in the FSM lattice 208 during analysis. Similarly, save and repair map buffers 238 may also be provided for storage of save and repair maps for setup and usage.

As described, the state machine engine 206 includes many different buffers. As will be appreciated, any of the buffers described herein may include the features of the storage buffer 50 described above. For example, any of the following may include features of the storage buffer 50: the data buffers 212, the process buffers 214, the state vector memory buffer 224, the state vector intermediate input buffer 226, the state vector intermediate output buffer 228, the match buffers 232, the restore and program buffers 236, the save and repair map buffers 238, and so forth.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A state machine engine, comprising:
   a bus interface configured to couple the state machine engine to a data bus;
   a first finite state machine lattice comprising a first plurality of programmable hardware elements comprising a plurality of selectively couple-able hardware elements, wherein the first finite state machine lattice is configured to:
   analyze data received by the state machine engine to generate match results between the data and the first plurality of programmable hardware elements programmed with first processing criteria to implement a first finite state machine; and
   output a first state vector comprising a state of the first plurality of programmable hardware elements indicative of the match results between the first plurality of programmable hardware elements and the data to facilitate subsequent processing of the data; and
   a first storage buffer coupled between the bus interface and the first finite state machine lattice, wherein the first storage buffer comprises a first portion of a memory cell array implemented in a memory device and the first storage buffer is configured to:
   store the data received by the state machine engine in the first portion of the memory cell array; and
   seamlessly supply the data to the first finite state machine lattice, wherein, to seamlessly supply the data, the first storage buffer is configured to:
   select a first memory cell column in the first storage buffer to output a first portion of the data during a first array cycle;
   select a second memory cell column in the first storage buffer to output a second portion of the data during a second array cycle; and
   delay selection of a third memory cell column in the first storage buffer to delay output of a third portion of the data from the third memory cell column until at least a third array cycle that occurs two array cycles after the second array cycle to allow both the first portion of the data and the second portion of the data to be fully output from the first storage buffer prior to occurrence of the third array cycle, wherein selection of an occurrence of the third array cycle is determined based upon output operational characteristics of the first storage buffer related to output capacity of the first storage buffer.

2. The state machine engine of claim 1, comprising a second finite state machine lattice, wherein the second finite state machine lattice comprises a second plurality of programmable hardware elements and the second finite state machine lattice is configured to:
   analyze the data received by the state machine engine to generate second match results between the data and the second plurality of programmable hardware elements programmed with second processing criteria to implement a second finite state machine; and output a second state vector indicative of the second match results between the second plurality of programmable hardware elements and the data received by the state machine engine to facilitate subsequent processing of the data;

wherein the first storage buffer is configured to seamlessly supply the data to the second finite state machine lattice in parallel with the first finite state machine lattice to facilitate analyzing the data based on the first processing criteria and the second processing criteria in parallel.

3. The state machine engine of claim 1, comprising:

a second finite state machine lattice, wherein the second finite state machine lattice comprises a second plurality of programmable hardware elements and the second finite state machine lattice is configured to:

analyze input data to generate second match results between the data and the second plurality of programmable hardware elements programmed with second processing criteria to implement a second finite state machine; and output a second state vector comprising a state of the second plurality of programmable hardware elements indicative of the second match results between the second plurality of programmable hardware elements and the input data to facilitate subsequent processing of the input data; and a second storage buffer coupled between an output of the first finite state machine lattice and an input of the second finite state machine lattice, wherein the second storage buffer comprises a second portion of the memory cell array and the second storage buffer is configured to:

store the first state vector received from the first finite state machine lattice in the second portion of the memory cell array; and seamlessly supply the first state vector to the second finite state machine lattice, wherein, to seamlessly supply the first state vector to the second finite state machine lattice, the second storage buffer is configured to:

select a first memory cell column in the second storage buffer to output a first portion of the first state vector during a fourth array cycle;

select a second memory cell column in the second storage buffer to output a second portion of the first state vector during a fifth array cycle; and delay selection of a third memory cell column in the second storage buffer to output a third portion of the first state vector until at least a sixth array cycle that occurs two array cycles after the fifth array cycle.

4. The state machine engine of claim 1, comprising a second storage buffer coupled between an output of the first finite state machine lattice and the bus interface, wherein the second storage buffer comprises a second portion of the memory cell array and the second storage buffer is configured to:

store the first state vector received from the first finite state machine lattice in the second portion of the memory cell array; and seamlessly supply the first state vector to the bus interface, wherein, to seamlessly supply the first state vector to the bus interface, the second storage buffer is configured to:

select a first memory cell column in the second storage buffer to output a first portion of the first state vector during a fourth array cycle;

select a second memory cell column in the second storage buffer to output a second portion of the first state vector during a fifth array cycle; and delay selection of a third memory cell column in the second storage buffer to output a third portion of the first state vector until at least a sixth array cycle that occurs two array cycles after the fifth array cycle.

5. The state machine engine of claim 1, wherein:

the each of the first plurality of programmable hardware elements is programmed to correspond with a state in the first finite state machine; and the first finite state machine lattice comprises a plurality of programmable switching elements, wherein the plurality of programmable switching elements are programmed to correspond with transitions between states in the first finite state machine.

6. The state machine engine of claim 1, wherein, to seamlessly supply the data to the first finite state machine lattice, the first storage buffer is configured to:

select the third memory cell column in the first storage buffer to output the third portion of the data during the third array cycle;

select a fourth memory cell column in the first storage buffer to output a fourth portion of the data during a fourth array cycle that occurs directly after the third array cycle; and delay selection of a fifth memory cell column in the first storage buffer to output of a fifth portion of the data until at least a fifth array cycle that occurs two array cycles after the third array cycle.

7. The state machine engine of claim 1, wherein, to seamlessly supply the data to the first finite state machine lattice, the first storage buffer is configured to:

select the third memory cell column in the first storage buffer to output the third portion of the data during the third array cycle that occurs two array cycles after the second array cycle when an input rate of the first storage buffer is two times an output rate of the first storage buffer; and select the third memory cell column in the first storage buffer to output the third portion of the data during a fourth array cycle that occurs four array cycles after the second array cycle when the input rate of the first storage buffer is four times the output rate of the first storage buffer.

8. The state machine engine of claim 1, comprising a plurality of registers coupled between the first storage buffer and data pins implemented on the memory device, wherein the plurality of registers is configured to:

receive and store the first portion of the data output from the first memory cell column in the first storage buffer while a column select signal is in a first state during the first array cycle;

output a first half of the first portion of the data from the plurality of registers to the data pins while the column select signal is in a second state during the first array cycle and while the column select signal is in the first state during the second array cycle;

receive and store the second portion of the data output from the second memory cell column in the first storage buffer while the column select signal is in the first state during the second array cycle;

output a second half of the first portion of the data from the plurality of registers to the data pins while the column select signal is in the second state during the second array cycle and during a fourth array cycle that occurs directly after the second array cycle;

output a first half of the second portion of the data from the plurality of registers to the data pins during the fourth array cycle and a fifth array cycle that occurs directly before the third array cycle; and output a second half of the second portion of the data from the plurality of registers to the data pins during fifth array cycle and while the column select signal is in the first state during the third array cycle.

9. The state machine engine of claim 1, wherein the first storage buffer does not include any registers.

10. The state machine engine of claim 1, comprising a second storage buffer communicatively coupled to an output of the first finite state machine lattice, wherein:

the second storage buffer comprises a second portion of the memory cell array;

the second storage buffer comprises a state vector memory buffer, a state vector immediate output buffer, a match buffer, or any combination thereof; and the first storage buffer comprises a data buffer, a process buffer, a state vector intermediate input buffer, or any combination thereof.

11. The state machine engine of claim 1, wherein the bus interface comprises a double data rate interface, a peripheral component interconnect interface, a NAND interface, or a flash interface.

12. The state machine engine of claim 1, wherein the memory device comprises dynamic random access memory, static random access memory, cross-point memory, or any combination thereof.

13. A state machine engine, comprising:

a bus interface configured to couple the state machine engine to a data bus;

a first finite state machine lattice comprising a first plurality of programmable hardware elements comprising a plurality of selectively couple-able hardware elements, wherein the first finite state machine lattice is configured to:

analyze data received by the state machine engine to generate match results between the data and the first plurality of programmable hardware elements programmed with first processing criteria to implement a first finite state machine, wherein the data received by the state machine engine comprises a data stream received over a communication network and wherein the first finite state machine lattice is configured to analyze the data received by the state machine engine to facilitate detecting presence of spam, malware, or both in the data stream; and output a first state vector comprising a state of the first plurality of programmable hardware elements indicative of the match results between the first plurality of programmable hardware elements and the data to facilitate subsequent processing of the data; and a first storage buffer coupled between the bus interface and the first finite state machine lattice, wherein the first storage buffer comprises a first portion of a memory cell array implemented in a memory device and the first storage buffer is configured to:

store the data received by the state machine engine in the first portion of the memory cell array; and seamlessly supply the data to the first finite state machine lattice, wherein, to seamlessly supply the data, the first storage buffer is configured to:

select a first memory cell column in the first storage buffer to output a first portion of the data during a first array cycle;

select a second memory cell column in the first storage buffer to output a second portion of the data during a second array cycle; and delay selection of a third memory cell column in the first storage buffer to delay output of a third portion of the data from the third memory cell column until at least a third array cycle that occurs two array cycles after the second array cycle.

14. A method for operating a storage buffer implemented in a state machine engine, comprising:

instructing, using at least one processor, a finite state machine lattice comprising a plurality of programmable hardware elements comprising a plurality of selectively couple-able hardware elements to program one or more of the plurality of programmable hardware elements with first processing criteria to implement a finite state machine in the state machine engine;

instructing, using the at least one processor, a first storage buffer comprising a first portion of a memory array implemented in a memory device to store data received by the state machine engine; and instructing, using the at least one processor, the first storage buffer to supply the data received by the state machine engine to the finite state machine lattice to enable the finite state machine lattice to analyze the data to generate match results between the data and the plurality of programmable hardware elements programmed with the first processing criteria to implement the finite state machine and to determine and output a state vector comprising a state of the plurality of programmable hardware elements indicative of the match results between the plurality of programmable hardware elements and the data to facilitate subsequent processing of the data, wherein supplying the data received by the state machine engine to the finite state machine lattice comprises:

activating a first memory cell column in the first portion of the memory array included in the first storage buffer to output a first portion of the data from the first memory cell column during a first array cycle;

activating a second memory cell column in the first portion of the memory array included in the first storage buffer to output a second portion of the data from the second memory cell column during a second array cycle; and abstaining from activation of a third memory cell column in the first portion of the memory array included in the first storage buffer to delay output of a third portion of the data from the third memory cell column until a third array cycle that occurs at least two array cycles after the second array cycle to allow both the first portion of the data and the second portion of the data to be fully output from the first storage buffer prior to occurrence of the third array cycle, wherein selection of an occurrence of the third array cycle is determined based upon output operational characteristics of the first storage buffer related to output capacity of the first storage buffer.

15. The method of claim 14, comprising:

instructing, using the at least one processor, a second storage buffer comprising a second portion of the memory array to store the state vector output from the finite state machine lattice; and instructing, using the at least one processor, the second storage buffer to output the state vector to a data bus coupled to the state machine engine, wherein outputting the state vector to the data bus comprises:
  activating a first memory cell column in the second portion of the memory array included in the second storage buffer to output a first portion of the state vector from the first memory cell column during a fourth array cycle;
  activating a second memory cell column in the second portion of the memory array included in the second storage buffer to output a second portion of the state vector from the second memory cell column during a fifth array cycle; and
  abstaining from activation of a third memory cell column in the second portion of the memory array included in the second storage buffer to delay output of a third portion of the state vector from the third memory cell column in the second portion of the memory array until a sixth array cycle that occurs at least two array cycles after the fifth array cycle.

16. The method of claim 14, wherein supplying the data received by the state machine engine to the finite state machine lattice comprises:
  receiving and storing the first portion of the data output from the first memory cell column in the first storage buffer in a plurality of registers while a column select signal is in a high state during the first array cycle;
  outputting a first half of the first portion of the data from the plurality of registers to data pins formed on memory device while the column select signal is in a low state during the first array cycle and while the column select signal is in the high state during the second array cycle;
  receiving and storing the second portion of the data output from the second memory cell column in the first storage buffer in the plurality of registers while the column select signal is in the high state during the second array cycle;
  outputting a second half of the first portion of the data from the plurality of registers to the data pins while the column select signal is in the low state during the second array cycle and during a fourth array cycle that occurs directly after the second array cycle;
  outputting a first half of the second portion of the data from the first storage buffer to the data pins during the fourth array cycle and a fifth array cycle that occurs directly before the third array cycle; and
  outputting a second half of the second portion of the data from the first storage buffer to the data pins during fifth array cycle and while the column select signal is in the high state during the third array cycle.

17. The method of claim 14, wherein supplying the data received by the state machine engine to the finite state machine lattice comprises:
  activating the third memory cell column in the first portion of the memory array included in the first storage buffer to output the third portion of the data from the third memory cell column during the third array cycle;
  activating a fourth memory cell column in the first portion of the memory array included in the first storage buffer to output a fourth portion of the data from the fourth memory cell column during a fourth array cycle; and
  abstaining from activation of a fifth memory cell column in the first portion of the memory array included in the first storage buffer to delay output of a fifth portion of the data from the fifth memory cell column until a fifth array cycle that occurs at least two array cycles after the second array cycle.

18. A method for operating a storage buffer implemented in a state machine engine, comprising:
  instructing, using at least one processor, a finite state machine lattice comprising a plurality of programmable hardware elements comprising a plurality of selectively couple-able hardware elements that correspond to a plurality of states of a finite state machine in the state machine engine to program one or more of the plurality of programmable hardware elements with first processing criteria to implement the finite state machine in the state machine engine;
  instructing, using the at least one processor, a first storage buffer comprising a first portion of a memory array implemented in a memory device to store data received by the state machine engine; and
  instructing, using the at least one processor, the first storage buffer to supply the data received by the state machine engine to the finite state machine lattice to enable the finite state machine lattice to analyze the data to generate match results between the data and the plurality of programmable hardware elements programmed with the first processing criteria to implement the finite state machine and to determine and output a state vector comprising a state of the plurality of programmable hardware elements indicative of the match results between the plurality of programmable hardware elements and the data to facilitate subsequent processing of the data, wherein a presence of spam, malware, or both is detected in the data analyzed by the finite state machine lattice based at least in part on the state vector determined by the finite state machine lattice, wherein the data analyzed by the state machine engine comprises a data stream received over a communication network, wherein supplying the data received by the state machine engine to the finite state machine lattice comprises:
    activating a first memory cell column in the first portion of the memory array included in the first storage buffer to output a first portion of the data from the first memory cell column during a first array cycle;
    activating a second memory cell column in the first portion of the memory array included in the first storage buffer to output a second portion of the data from the second memory cell column during a second array cycle; and
    abstaining from activation of a third memory cell column in the first portion of the memory array included in the first storage buffer to delay output of a third portion of the data from the third memory cell column until a third array cycle that occurs at least two array cycles after the second array cycle.

19. A system comprising a memory module, wherein the memory module comprises:
  data pins configured to communicatively couple the memory module to an external data bus;
  an array of memory cells each configured to store data;
  a first storage buffer comprising a first portion of the array; and
  a memory controller configured to operate the memory cells implemented in the first portion of the array by instructing the array to:
    store input data to be analyzed by the system in the memory cells implemented in the first portion of the array;

activate a first column in the first portion of the array to output a first portion of the input data from the first column in the first portion of the array during a first array cycle via transitioning a column select signal in response to a first pulse of a read command signal;

activate a second column in the first portion of the array to output a second portion of the input data from the second column in the first portion of the array during a second array cycle directly after the first array cycle via transitioning the column select signal in response to a second pulse of the read command signal directly subsequent to the first pulse of the read command signal;

delay activation of a third column in the first portion of the array by abstaining from transitioning a column select signal in response to a third pulse of a read command signal directly subsequent to the second pulse of the read command signal for a predetermined number of cycle array times beyond the second array cycle to delay output of a third portion of the input data from the third column in the first portion of the array; and complete a transfer of the first portion of the input data and the second portion of the input data during the predetermined number of cycle array times beyond the second array cycle to allow both the first portion of the input data and the second portion of the input data to be fully output from the first storage buffer during the predetermined number of cycle array times, wherein selection of the predetermined number of cycle array times is determined based upon output operational characteristics of the first storage buffer related to output capacity of the first storage buffer.

20. A system, comprising:
a memory module, wherein the memory module comprises:
data pins configured to communicatively couple the memory module to an external data bus;
an array of memory cells each configured to store data;
a first storage buffer comprising a first portion of the array; and
a memory controller configured to operate the memory cells implemented in the first portion of the array by instructing the array to:
store input data to be analyzed by the system in the memory cells implemented in the first portion of the array;
activate a first column in the first portion of the array to output a first portion of the input data from the first column in the first portion of the array during a first array cycle via transitioning a column select signal in response to a first pulse of a read command signal;
activate a second column in the first portion of the array to output a second portion of the input data from the second column in the first portion of the array during a second array cycle directly after the first array cycle via transitioning the column select signal in response to a second pulse of the read command signal directly subsequent to the first pulse of the read command signal;
delay activation of a third column in the first portion of the array by abstaining from transitioning a column select signal in response to a third pulse of a read command signal directly subsequent to the second pulse of the read command signal for a predetermined number of cycle array times beyond the second array cycle to delay output of a third portion of the input data from the third column in the first portion of the array; and
complete a transfer of the first portion of the input data and the second portion of the input data during the predetermined number of cycle array times beyond the second array cycle;
a communication port configured to communicatively couple the system to a communication network that transmits a data stream comprising the input data to be analyzed by the system;
a hardware element coupled between the first storage buffer and the external data bus, wherein the hardware element is programmed to implement at least a portion of a finite state machine that outputs a state vector based at least in part on analysis of the input data; and
a processor coupled to the external data bus, wherein the processor is programmed to detect presence of spam, malware, or both in the data stream based at least in part on the state vector.

21. The system of claim 19, wherein, to operate the memory cells implemented in the first portion of the array as the first storage buffer, the memory controller is configured to:
abstain from activation of the third column in the first portion of the array to preclude output of the third portion of the input data from the third column in the first portion of the array during a fourth array cycle that occurs directly after the second array cycle;
abstain from activation of the third column in the first portion of the array to preclude output of the third portion of the input data from the third column in the first portion of the array during a fifth array cycle that occurs directly after the fourth array cycle; and
activate the third column in the first portion of the array to output the third portion of the input data from the third column in the first portion of the array during a third array cycle that occurs directly after the fifth array cycle.

22. The system of claim 19, comprising a hardware element coupled between the first storage buffer and the external data bus, wherein:
the hardware element is programmed to implement at least a portion of a finite state machine that outputs a state vector based at least in part on analysis of the input data; and
the memory controller configured to operate the memory cells implemented in a second portion of the array as a second storage buffer by instructing the array to:
store the state vector output from the finite state machine in the memory cells implemented in the second portion of the array;
activate a first column in the second portion of the array to output a first portion state vector from the first column in the second portion of the array during a fourth array cycle;
activate a second column in the second portion of the array to output a second portion of the state vector from the second column in the second portion of the array during a fifth array cycle directly after the fourth array cycle; and
delay activation of a third column in the second portion of the array to delay output of a third portion of the state vector from the third column in the second portion of the array until a sixth array cycle that occurs two array cycles after the fifth array cycle.

23. The system of claim 19, wherein, to operate the memory cells implemented in the first portion of the array as the first storage buffer, the memory controller configured to:
 activate the third column in the first portion of the array to output the third portion of the input data from the first column in the first portion of the array during a third array cycle directly after the predetermined number of cycle array times;
 activate a fourth column in the first portion of the array to output a fourth portion of the input data from the fourth column in the first portion of the array during a fourth array cycle directly after the third array cycle; and
 delay activation of a fifth column in the first portion of the array to delay output of a fifth portion of the input data from the fifth column in the first portion of the array until a fifth array cycle that occurs two array cycles after the second array cycle.

24. The system of claim 19, wherein the memory controller configured to operate the memory cells implemented in a second portion of the array as system memory.

25. The system of claim 19, wherein the first storage buffer does not include any registers.

26. The system of claim 19, wherein:
 the first storage buffer comprises a word line coupled to a row of memory cells in the array of memory cells;
 the first column in the first portion of the array comprises a first plurality of bit lines each coupled to a column of memory cells in the first portion of the array;
 the second column in the first portion of the array comprises a second plurality of bit lines each coupled to a column of memory cells in the first portion of the array; and
 the third column in the first portion of the array comprises a third plurality of bit lines each coupled to a column of memory cells in the first portion of the array.

27. The system of claim 19, comprising a hardware element communicatively coupled to the first storage buffer, wherein the hardware element is programmed with processing criteria such that the hardware element selectively activates a downstream hardware element based at least in part on a match between the input data and the processing criteria to facilitate analyzing the input data.

28. A storage buffer comprising:
 a word line coupled to a row of memory cells implemented in a memory cell array, wherein the row of memory cells is configured to store data to be output from the storage buffer;
 a first column comprising a first plurality of bit lines each coupled to one of a first plurality of memory cells in the row of memory cells;
 a second column comprising a second plurality of bit lines each coupled to one of a second plurality of memory cells in the row of memory cells; and
 a third column comprising a third plurality of bit lines each coupled to one of a third plurality of memory cells in the row of memory cells;
 wherein, in response to receipt of a read command, the storage buffer is configured to:
  pulse a column select signal in response to a first pulse of a read command signal during a first array cycle to activate the first column such that each of the first plurality of memory cells outputs one bit of the data as first output data to a corresponding one of the first plurality of bit lines;
  pulse the column select signal in response to a second pulse of the read command signal directly subsequent to the first pulse of the read command signal during a second array cycle directly after the first array cycle to activate the second column such that each of the second plurality of memory cells outputs one bit of the data as second output data to a corresponding one of the second plurality of bit lines;
  abstain from pulsing of the column select signal in response to a plurality of pulses of the read command signal directly subsequent to the second pulse of the read command signal during a first plurality of array cycles that occur directly after the second array cycle;
  complete a transfer of the first output data and the second output data during the first plurality of array cycles that occur directly after the second array cycle to allow both the first output data and the second output data to be fully output from the storage buffer during the first plurality of array cycles, wherein selection of the first plurality of array cycles is determined based upon output operational characteristics of the storage buffer related to output capacity of the storage buffer; and
  pulse the column select signal during a third array cycle directly after the first plurality of array cycles to activate the third column such that each of the third plurality of memory cells outputs one bit of the data as third output data to the corresponding one of the third plurality of bit lines.

29. The storage buffer of claim 28, comprising a fourth column, wherein:
 the fourth column comprises a fourth plurality of bit lines each coupled to one of a fourth plurality of memory cells in the row of memory cells; and
 the storage buffer is configured to pulse the column select signal during a fourth array cycle directly after the third array cycle to activate the fourth column such that each of the fourth plurality of memory cells outputs one bit of the data to a corresponding one of the fourth plurality of bit lines in response to receipt of the read command.

30. The storage buffer of claim 29, comprising a fifth column, wherein:
 the fifth column comprises a fifth plurality of bit lines each coupled to one of a fifth plurality of memory cells in the row of memory cells; and
 in response to receipt of the read command, the storage buffer is configured to:
  abstain from pulsing of the column select signal during a second plurality of array cycles that occur directly after the fourth array cycle; and
  pulse the column select signal during a fifth array cycle directly after the second plurality of array cycles to activate the fifth column such that each of the fifth plurality of memory cells outputs one bit of the data to a corresponding one of the fifth plurality of bit lines.

* * * * *